US009274196B2

(12) United States Patent  
Zenge

(10) Patent No.: US 9,274,196 B2
(45) Date of Patent: Mar. 1, 2016

(54) METHOD AND MAGNETIC RESONANCE SYSTEM TO GENERATE ANGIOGRAPHY IMAGES

(71) Applicant: Michael Zenge, Nuremberg (DE)

(72) Inventor: Michael Zenge, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 542 days.

(21) Appl. No.: 13/677,594

(22) Filed: Nov. 15, 2012

(65) Prior Publication Data

US 2013/0119983 A1    May 16, 2013

(30) Foreign Application Priority Data

Nov. 15, 2011 (DE) ...................... 10 2011 1 086 369

(51) Int. Cl.
*G01V 3/00*    (2006.01)
*G01R 33/56*    (2006.01)
*G01R 33/563*    (2006.01)
*G01R 33/567*    (2006.01)
*G01R 33/48*    (2006.01)

(52) U.S. Cl.
CPC ............ *G01R 33/56* (2013.01); *G01R 33/5635* (2013.01); *G01R 33/5676* (2013.01); *G01R 33/4826* (2013.01)

(58) Field of Classification Search
CPC ....................................................... G01R 33/56
USPC ........................................................ 324/309
See application file for complete search history.

(56) References Cited

U.S. PATENT DOCUMENTS

| 5,095,906 | A  | * | 3/1992 | Ema ............................... 600/407 |
| 5,830,143 | A  | * | 11/1998 | Mistretta et al. .............. 600/420 |
| 6,144,200 | A  |  | 11/2000 | Epstein et al. |
| 6,198,959 | B1 | * | 3/2001 | Wang ............................ 600/413 |
| 6,353,752 | B1 | * | 3/2002 | Madore et al. ................ 600/410 |
| 6,393,313 | B1 | * | 5/2002 | Foo ............................... 600/410 |
| 6,487,435 | B2 | * | 11/2002 | Mistretta et al. .............. 600/420 |
| 7,647,088 | B2 | * | 1/2010 | Mistretta et al. .............. 600/428 |
| 7,853,060 | B2 | * | 12/2010 | Schmitt et al. ................ 382/128 |
| 8,089,278 | B1 | * | 1/2012 | Du ................................ 324/307 |
| RE43,749  | E  | * | 10/2012 | Miyazaki et al. ............. 600/410 |
| 2006/0264735 | A1 |  | 11/2006 | Stemmer |
| 2009/0010514 | A1 | * | 1/2009 | Kimura ........................ 382/131 |
| 2009/0148021 | A1 |  | 6/2009 | Yui |
| 2010/0045292 | A1 |  | 2/2010 | Zenge |
| 2010/0231217 | A1 |  | 9/2010 | Gross et al. |
| 2010/0280357 | A1 |  | 11/2010 | Bi et al. |
| 2011/0251477 | A1 | * | 10/2011 | Schmitt ........................ 600/410 |
| 2013/0285655 | A1 | * | 10/2013 | Miyazaki et al. ............. 324/309 |
| 2014/0062477 | A1 | * | 3/2014 | Carroll et al. ................. 324/309 |
| 2014/0103928 | A1 | * | 4/2014 | Grodzki ....................... 324/309 |

FOREIGN PATENT DOCUMENTS

| CN | 101455565 A | 6/2009 |
| JP | 2007082753 A | 4/2007 |

* cited by examiner

*Primary Examiner* — Rodney Fuller
(74) *Attorney, Agent, or Firm* — Schiff Hardin LLP

(57) ABSTRACT

In the generation of MR angiography images of a predetermined three-dimensional volume segment of a living examination subject using means a magnetic resonance system, MR data in the volume segment are acquired by radial acquisition of k-space. The MR data are analyzed in order to subdivide the MR data into groups, with each group including only the MR data that correspond to a specific heart beat phase of the heat of the examination subject. MR angiography images are generated based only on the MR data of one of these groups.

10 Claims, 3 Drawing Sheets

METHOD AND MAGNETIC RESONANCE SYSTEM TO GENERATE ANGIOGRAPHY IMAGES

BACKGROUND OF THE INVENTION

1. Field of the Invention

The present invention concerns a method to generate MR angiography images, as well as a correspondingly designed magnetic resonance apparatus.

2. Description of the Prior Art

As is known, the generation of MR angiography images takes place either by injecting a contrast agent before the acquisition of the MR data, or injection of a contrast agent is foregone. In methods in which the injection of the contrast agent is foregone, the data acquisition is conventionally assisted by activation of an EKG (electrocardiogram). Using this EKG activation, in the data acquisition it is known whether the corresponding MR data are acquired during the arterial phase or during the venous phase of the heart. The arterial phase is the phase in which the heart pumps the blood in the arteries. The venous phase is the phase in which the blood is directed back to the heart via the veins.

It is known that a series of problems results from the detection and post-processing of the EKG signal. For example, injection of the RF signals (generated by the magnetic resonance system) into the EKG hardware lead to false activation signals by the EKG hardware. Moreover, a variable heart beat (arrhythmia) of the patient leads to problems in the data acquisition because, in this case, the point in time of the data acquisition is frequently associated with the wrong phase. Furthermore, a delay time must be allowed dependent on the distance that the blood vessels to be examined are from the heart. Finally, EKG activation signals and the corresponding arterial or venous phase have only slight correlations at distal segments of a vascular tree, such that the EKG activation signals do not optimally coincide with the respective phases given existing deviations of the physiology of the patient from the norm.

SUMMARY OF THE INVENTION

An object of the present invention is to generate MR angiography images without contrast agent and without MR activation signals.

Within the scope of the present invention, a method is provided to create MR angiography images of a predetermined three-dimensional volume segment of a living examination subject with the use of a magnetic resonance system. The method according to the invention includes the following steps:

Radial acquisition of MR data in a volume segment. Radial acquisition of the MR data means a radial scanning of k-space corresponding to the volume segment. The time duration to acquire the MR data can correspond to only one heart beat cycle, or extend over multiple heart beat cycles.

Analysis of the MR data such that the MR data are divided into groups by the analysis. Each of these groups includes only the MR data that were acquired during a specific heart beat phase of the heart of the examination subject. In other words: exclusively through the analysis of the MR data (thus for example without EKG activation signal), each MR datum or each element of the MR data can be associated with a specific group, and each group includes only those MR data that have been acquired during a specific heart beat phase.

The MR angiography images are then generated depending on, or depending only on, the MR data of one of these groups.

According to the invention, a technique based on the "Time of Flight" approach, for example FLASH ("Fast Low Angle Shot"), can be used to generate the MR angiography images. However, an acquisition technique based on the approach known as TrueFISP ("True Fast Imaging with Steady State Precession") is also possible according to the invention for the creation of the MR angiography images.

By the analysis of the MR data according to the invention, the erroneous linking to an EKG control signal can be omitted. Expressed differently according to the invention, the information that is conventionally fed via the angiography images into the generation method for the MR angiography images is detected by the analysis of the MR data, and is subsequently used in the generation of the MR angiography images.

The radial acquisition of k-space can be implemented according to an embodiment of the invention such that the MR data are acquired successively for multiple respective spokes. Each spoke proceeds through the center of k-space. The respective next spoke can be selected with the use of the golden angle, such that the next spoke falls into the middle of the largest gap that is present within the already acquired spokes.

According to this embodiment, the process starts with an arbitrary spoke along which the MR data are scanned. With the use of the golden angle, starting from the already scanned spokes, the next spoke is determined such that this next spoke falls in the middle of the largest spatial segment within k-space that does not yet have a scanned spoke.

The MR data acquisition by means of the golden angle guarantees that the same spoke is never scanned twice. Moreover, the MR data acquisition can advantageously be interrupted after every acquired spoke that has just been acquired, without k-space being non-uniformly scanned.

For example, each spoke to be scanned can be defined by the center point of k-space and by a point on a hemisphere whose center point is also the center point of k-space. Each point on this hemisphere is defined by the center point of the sphere and of k-space via a polar angle and an azimuthal angle. The polar angle describes a spoke, under the assumption of a Cartesian coordinate system with the origin identical to the center point of the hemisphere and k-space, and is the angle between the positive x-axis of this coordinate system and the projection of the spoke in the x/y plane of the coordinate system. The azimuthal angle describes the angle between the positive z-axis of this coordinate system and the spoke.

For example, the polar angle $\Theta_n$ of the n-th spoke can be determined according to the following equation:

$$\Theta_n = \frac{\pi \times \sqrt{n}}{2 \times \sqrt{N}} \quad (1)$$

n is the numerical index of the current spoke to be determined, and N is the number of the total spokes to be determined.

The azimuthal angle $\phi_n$ of the n-th spoke can be determined corresponding to the following equation:

$$\Phi_n = \mathrm{mod}\,(n \times \Psi, 2 \times \pi) \quad (2)$$

The golden angle ψ can be either the small golden angle $\psi_1$ (Equation (3)) or the large golden angle $\psi_2$ (Equation (4)).

$$\Psi_1 = 360° - \frac{720°}{1+\sqrt{5}} \approx 137.5° \quad (3)$$

$$\Psi_2 = \frac{720°}{1+\sqrt{5}} \approx 222.5° \quad (4)$$

According to a further embodiment of the invention, for each spoke only those MR data are evaluated in a middle region of k-space (in the area of the center) in order to respectively determine an average energy for the respective spoke. According to this embodiment, the sub-division of the MR data into the corresponding groups is implemented depending on a change of the average energy over time.

Expressed differently in the evaluation of the MR data of a spoke only the MR data that lie in the middle region of this spoke are evaluated. Since the middle point of the spoke corresponds to the middle point of k-space, this middle region of the respective spoke also lies in the middle region of k-space. The region can be determined, for example, by a distance from the middle point of k-space. If this distance corresponds to 50% (or 30%), of the radius of k-space, for example, only 50% (or 30%) of the MR data of the respective spoke are evaluated to determine the average energy for this spoke.

Since the spokes are read out in succession, a time curve of the average energy results. Using this time curve of the average energy of the spokes, the individual spoke, and thus the MR data of the individual spoke, can then be associated with the respective group.

The arterial blood is pumped through the arteries in a pulsing (pulsatile) form or with multiple pulsing waves. In contrast to this, the blood flow through the veins takes place substantially continuously (i.e. not pulsed). Moreover, the flow rate of the venous blood is on average less than the flow rate of the arterial blood. While the entire blood flow (sum of arterial and venous blood) is dominated essentially by the arterial blood during the arterial heart beat phase, the entire blood flow during the venous heart beat phase is essentially dominated by the venous blood, or at least is less disrupted by the arterial blood than during the arterial heart beat phase.

In the generation of MR angiography images, the spins within the three-dimensional volume segment (that corresponds with k-space) are saturated by suitably radiated RF pulses, so that only fresh or unsaturated blood flowing into the volume segment leads to white or bright points in the MR angiography images, while the remaining MR angiography image remains essentially dark. In this approach (also known as "Time of Flight"), the fresh blood flowing into the field of view nearly on its own delivers a positive, bright contrast to the remaining dark background signal. This means that static parts of the volume segment are saturated, which then leads to black image points, while particles moving into the saturated region have unsaturated spins, which then leads to bright image points.

To sub-divide the MR data into the different groups, according to a preferred embodiment of the invention a Fourier transformation of the acquired MR data can be implemented in order to generate a frequency spectrum of the MR data. If this frequency spectrum is filtered, only the frequencies of the MR data of a specific group are not suppressed. The MR angiography images can then be created depending only on the MR data of this specific group.

For example, if the time curve of the averaged energy of the acquired spokes are subjected to a Fourier transformation, a different frequency spectrum thus results for the time period of the arterial heart beat phase, for example, than for the other heart beat phases (for example venous heart beat phase, transition phase). The time curve of the capacity during the arterial phase is characterized by higher frequencies due to the pulse-shaped curve, while the time curve of the capacity during the venous phase has lower frequencies, which are still higher than those frequencies that occur during the transition phase. With a suitable filtering it is therefore possible to determine those MR data that are acquired during the arterial heart beat phase. MR angiography images that are created depending on the MR data acquired during the arterial heart beat phase essentially show only the arteries within the volume segment.

In the case of a standing person, arterial blood above the heart essentially flows upwardly and below the heart essentially flows downwardly, while venous blood above the heart essentially flows downwardly and below the heart essentially flows upwardly. If, in the generation of MR angiography images of the vascular tree below/above the heart, a saturation band is placed below/above the volume segment to be acquired, the venous blood flowing from this saturated band into the volume segment to be acquired is then also saturated, such that essentially only arterial blood contributes to the signal in the imaging of the vascular tree.

Preferably, only the MR angiography images are generated with the use of an iterative reconstruction method. Iterative reconstruction methods can supplement missing or unacquired MR data based on a prior knowledge of the MR image to be generated. For example, this prior knowledge can be the attitude or the dimensions of blood vessels in the volume segment to be acquired. Since this attitude and these dimensions of the blood vessels should change only slightly in two MR images which represent adjacent slices within the volume segment singularly detected, larger deviations from this attitude, or from dimensions, can be penalized by a corresponding penalty term. With the use of this penalty term, in the iterative reconstruction of the n-th MR image it is accordingly ensured that the currently reconstructed n-th MR image does not differ to significantly from the previously reconstructed MR images.

Compressed scanning according to the invention can be used as a variant of the iterative reconstruction method. Compressed scanning is a statistical technique for data acquisition and data estimation which aims to acquire or scan only relatively few measurement points in k-space. In spite of this, under specific conditions these sparse measurement values acquired in k-space can then nearly reproduce the complete information which, without compressed scanning, can be reconstructed only by an acquisition of all measurement points in k-space. These conditions are satisfied precisely in the generation of MR angiography images since here only slight differences occur between adjacent MR images, and since the information to be acquired is concentrated only at a small proportion of the image points (namely the image points that represent blood vessels), while the remaining image points have only a relatively low signal intensity.

By the use of an iterative reconstruction method, both the resolution and the signal-to-noise ratio of the MR angiography images created according to the invention can be improved. The number and severity of the artifacts can also be reduced by the use of an iterative reconstruction method in comparison to non-iterative methods. Moreover, the use of iterative reconstruction methods the acquisition of only 50%, for example, of the spokes in k-space, without quality losses in the generated MR angiography images having to be accepted in comparison to an MR data acquisition in which all spokes in k-space are acquired.

The use of an iterative reconstruction method is particularly advantageous when multiple RF acquisition coils are used to acquire MR data. The iterative reconstruction method can advantageously use the spatial redundancy of the MR data acquired simultaneously by multiple RF coils to improve the quality of the MR angiography images to be generated.

The present invention also encompasses a magnetic resonance system to generate MR angiography images in a predetermined three-dimensional volume segment within an examination subject. The magnetic resonance system includes a basic field magnet, a gradient field system, one or more RF antennas, and a control device to control the gradient field system and the RF antenna(s), to receive the measurement signals that are acquired by reception coils of the RF antenna(s), and to evaluate the measurement signals and generate the MR image data sets. The magnetic resonance system excites the three-dimensional volume segment with an RF excitation pulse and then acquires radial MR data in k-space corresponding to the volume segment. These MR data are analyzed by the magnetic resonance system in order to subdivide the MR data into groups, with each group includes only those MR data that belong to a specific heart beat phase of the heart of the examination subject. Expressed differently the magnetic resonance system can determine during which heart beat phase a specific portion of the MR data was acquired, only by the analysis of the MR data, in order to then assign the corresponding group to each portion of the MR data. The magnetic resonance system subsequently generates the MR angiography images based only on the MR data of one of these groups.

The advantages of the magnetic resonance system according to the invention essentially correspond to the advantages of the method according to the invention described in detail above.

Furthermore, the present invention encompasses aa non-transitory, computer-readable data storage medium encoded with programming instructions, which can be loaded into a memory of a programmable control device or a computer of a magnetic resonance system. The programming instructions cause all or various embodiments of the method according to the invention that are described above to be executed by the control device. The programming instructions may require program means (for example libraries and auxiliary functions) in order to realize the corresponding embodiments of the method. The programming instructions may be source code (C++, for example) that must still be compiled and linked, or that must only be interpreted, or can be executable software code that has only to be loaded into the corresponding computer or control device for execution.

The electronically readable data medium can be, for example a DVD, a magnetic tape or a USB stick on which is stored electronically readable control information, in particular software.

The present invention is particularly suitable for reconstruction of MR angiography images based on MR data of a three-dimensional volume segment that are acquired continuously during a continuous table feed (meaning that the examination subject is slid continuously into the magnetic resonance system). The continuous table feed advantageously enables the data acquisition within a volume that is nearly unlimited in the table shift direction. According to the invention, peripheral vascular trees of the examination subject can thereby be seamlessly created with a high resolution without the administration of contrast agents and without an external trigger pulse by an EKG apparatus.

Naturally, however, the present invention is not limited to this preferred field of application since the present invention can also be used, for example, to generate MR angiography images that are based on acquired MR data given a stationary table (meaning that the examination subject or the volume segment does not change its attitude relative to the magnetic resonance system during the data acquisition).

DESCRIPTION OF THE PREFERRED EMBODIMENTS

Figure 1:
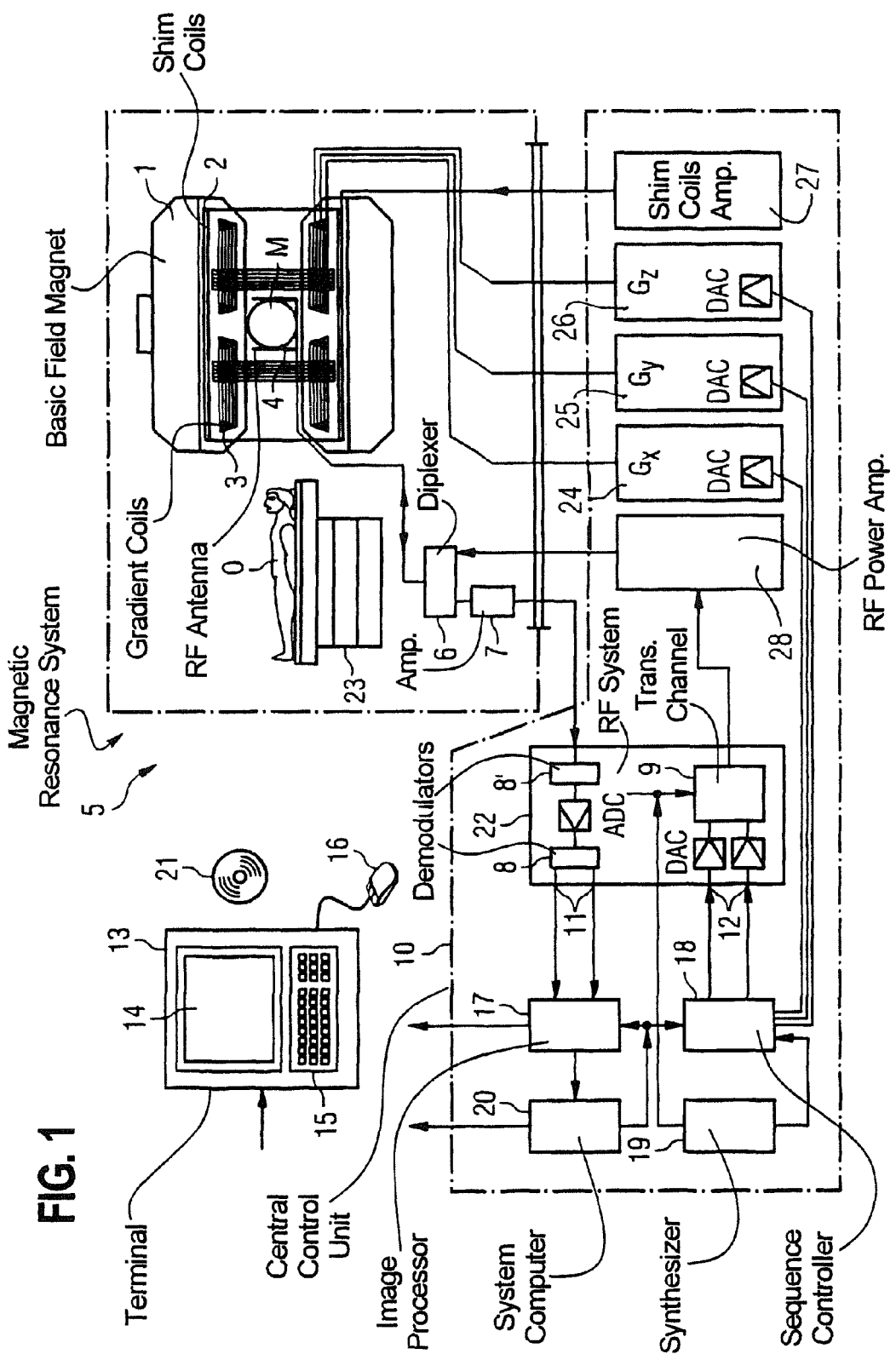
FIG. 1 schematically illustrates a magnetic resonance system according to the invention.

FIG. 1 is a schematic representation of a magnetic resonance system 5 (of a magnetic resonance imaging or magnetic resonance tomography apparatus). A basic field magnet 1 generates a temporally constant, strong magnetic field for polarization or alignment of the nuclear spins in a volume segment of an examination subject O, for example of a part of a human body that is to be examined, lying on a table 23 that is driven continuously into the magnetic resonance system 5 for examination or measurement (data acquisition). The high homogeneity of the basic magnetic field that is required for the magnetic resonance measurement is defined in a typically spherical measurement volume M in which are arranged the part or parts of the human body to be examined. To support the homogeneity requirements, and in particular to eliminate temporally invariable influences, shim plates made of ferromagnetic material are mounted at a suitable point. Temporally variable influences are eliminated by shim coils 2 and a suitable controller or amplifier 27 for the shim coils 2.

A cylindrical gradient coil system 3 that includes three sub-windings is used in the basic field magnet 1. Each sub-winding is supplied by an amplifier with current to generate a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. The amplifier comprises a digital/analog converter which is controlled by a sequence controller 18 for accurately-timed generation of gradient pulses.

Located within the gradient field system 3 are multiple radio-frequency antennas 4 that convert the radio-frequency pulses emitted by a radio-frequency power amplifier 28 into an alternating magnetic field to excite the nuclei and align the nuclear spins of the subject to be examined, or of the region of the subject O that is to be examined. Each radio-frequency antenna 4 has one or more RF transmission coils and multiple RF reception coils in the form of an annular (preferably linear or matrix-like) arrangement of component coils. The alternating field emanating from the precessing nuclear spins—i.e. normally nuclear spin echo signals caused by a pulse sequence composed of one or more radio-frequency pulses and one or more gradient pulses—is also transduced by the RF reception coils of the respective radio-frequency antenna 4 into a voltage (measurement signal) that is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are represented digitally in the sequence controller 18 as a series of complex numbers. This number series is supplied as real part and imaginary part via respective inputs 12 to a digital/analog converter in the radio-frequency system 22, and from this to a transmission channel 9. In the transmission channel 9 the pulse sequences are modulated on a radio-frequency carrier signal whose base frequency corresponds to the center frequency.

The switch-over from transmission operation to reception operation takes place via a transmission/reception diplexer 6. The RF transmission coils of the radio-frequency antennas 4 radiate the radio-frequency pulses into the measurement volume M to excite the nuclear spins, and resulting echo signals are sampled via the RF reception coils. The correspondingly acquired magnetic resonance signals are phase-sensitively demodulated at an intermediate frequency in a reception channel 8' (first demodulator) of the radio-frequency system 22 and are digitized in the analog/digital converter (ADC). This signal is further demodulated to a frequency of 0. The demodulation to a frequency of 0 and the separation into real part and imaginary part occur after the digitization in the digital domain in a second demodulator 8. An MR angiography image or three-dimensional image data set is reconstructed by an image computer 17 from the measurement data acquired in such a manner. The administration of the measurement data, the image data and the control programs takes place via the system computer 20. Based on a specification with control programs, the sequence controller 18 controls the generation of the respective desired pulse sequences and the corresponding scanning of k-space. In particular, the sequence controller 18 thereby controls the accurately-timed switching (activation) of the gradients, the emission of the radio-frequency pulses with defined phase amplitude, and the reception of the nuclear magnetic resonance signals. The time base for the radio-frequency system 22 and the sequence controller 18 is provided by a synthesizer 19. The selection of corresponding control programs to generate an MR angiography image (stored on a DVD 21, for example) and the presentation of the generated MR angiography image take place via a terminal 13 that has a keyboard 15, a mouse 16) and a monitor 14.

Figure 2:
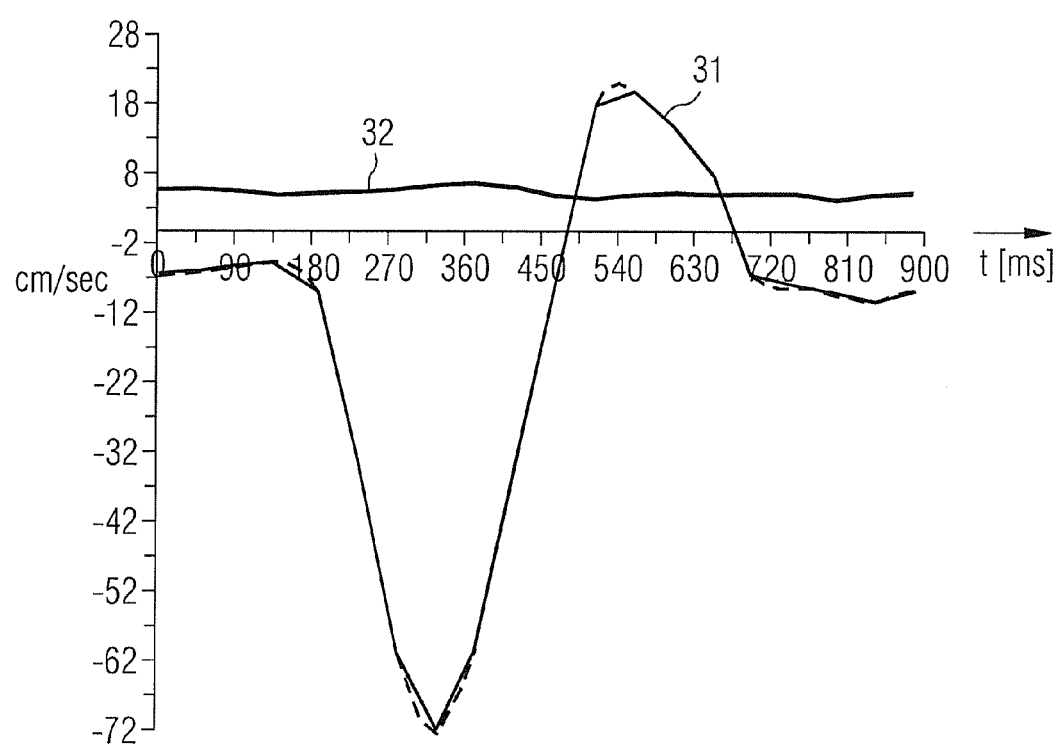
FIG. 2 shows an example of flow rates in the arteries and in the veins.

In FIG. 2. the flow rates of the arterial blood 31 and the venous blood 32 are shown over time t for a heartbeat for blood vessels in a human leg. A blood flow upward from below in the leg is thereby represented with a positive speed. It is apparent that the flow rate of the arterial blood 31 clearly changes within a heartbeat while, in comparison to this, the flow rate of the venous blood 32 runs nearly constant. Moreover, it can be seen from FIG. 2 that, although there is a return flow of the arterial blood (time interval from approximately 490 ms to 675 ms), there is no return flow of the venous blood.

In the velocity curve of the arterial blood 31 over time t that is shown in FIG. 2, the arterial phase corresponds to a time window which begins at approximately 200 ms and ends at approximately 400 ms. During this arterial phase the blood flow (i.e. the combined blood flow made up of the arterial blood and venous blood) is dominated by the arterial blood. In contrast to this, the venous phase corresponds to a time window which begins at approximately 700 ms and ends at approximately 10 ms (in the next heart beat).

The arterial phase and the venous phase are determined via a corresponding analysis of the MR data acquired during multiple heart beats. The acquired MR data are subsequently assigned to the arterial phase, the venous phase or neither of the two phases, such that then MR angiography images of the arteries or of the veins can be generated using the MR data that were assigned to the arterial or venous phase, respectively.

Figure 3:
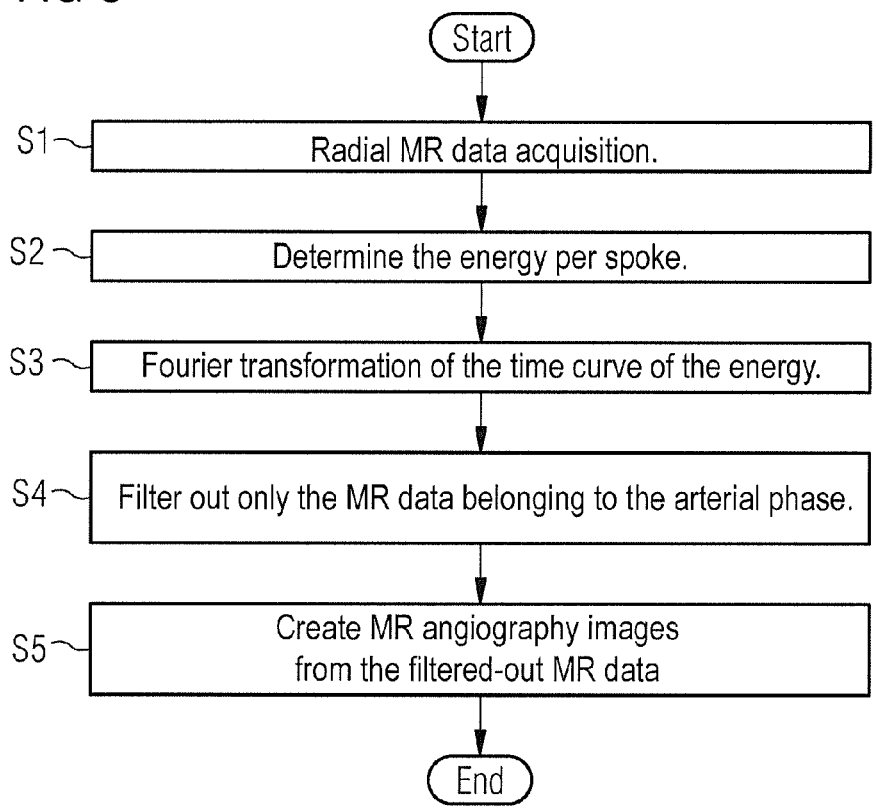
FIG. 3 is a flowchart of an embodiment of the method according to the invention for the generation of MR angiography images of a three-dimensional volume.

The example of a workflow of a method according to the invention to create MR angiography images is shown in FIG. 3.

In a first Step S1, radial MR data are acquired in k-space which corresponds to the three-dimensional volume segment from which the MR angiography images are to be created. In the radial MR data acquisition, the MR data are acquired spoke by spoke in temporally successive steps.

The energy of the MR data acquired per spoke is determined in a second Step S2.

In the following Step S3, the time curve of the energy determined in Step S2 per spoke is subjected to a Fourier transformation.

In Step S4, only those MR data which were acquired during the arterial heart beat phase are subsequently filtered out. Since the spectrum of the time curve of the power per spoke differs depending on whether the MR data were acquired during the arterial heart beat phase or during another heart beat phase, only those MR data that were acquired during the arterial heart beat phase are determined or filtered out by a frequency filter extraction.

In Step S5, MR angiography images are subsequently reconstructed, with only the filtered-out MR data—thus only the MR data acquired during the arterial heart beat phase—being used for the reconstruction. Given a continuous table movement, a stack of axial MR angiography images can be generated that then image the arterial vascular system. An axial MR image thereby represents a slice of the volume segment that extends perpendicularly to the movement direction of the table.

If the MR data of the venous heart beat phase are filtered out in Step S4, and if the stack of axial MR angiography images is created depending on the filtered-out MR data, the individual MR images then image the venous vascular system within the volume segment instead of the arterial vascular system.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate magnetic resonance (MR) angiography images of a predetermined three-dimensional volume segment of a living subject, comprising:

operating an MR data acquisition unit, in which a living subject is located, to acquire MR data from a predetermined three-dimensional volume segment of the subject, and entering the acquired MR data into k-space along multiple radial trajectories in k-space;

in a processor, automatically executing an analysis of the MR data entered into k-space in order to subdivide said MR data entered into k-space into a plurality of individually selectable groups, with said analysis causing each group to comprise only MR data acquired during a predetermined heartbeat phase of the heart of the subject; and in said processor, generating an MR angiography image using only MR data from a selected one of said groups.

2. A method as claimed in claim 1 comprising:
entering said MR data into k-space along a plurality of radial spokes as said radial trajectories, each spoke proceeding through a center of k-space, with k-space corresponding to said predetermined volume segment; and
after entering said MR data into one of said spokes, selecting a next spoke along which MR data will be entered in k-space using the golden angle in order to cause said next spoke to be centrally located in a largest gap that exists between previously-acquired spokes.

3. A method as claimed in claim 2 comprising:
implementing said analysis of said MR data in k-space by evaluating only MR data in a middle region of k-space for each spoke, and from said MR data in said middle region, determining an average energy; and
implementing the subdivision into said plurality of groups dependent on a change of said average energy over time.

4. A method as claimed in claim 1 comprising:
defining, in said plurality of groups, an arterial group that comprises only MR data corresponding to an arterial heartbeat phase; and
acquiring said MR data in said arterial group using a pulsatile blood flow.

5. A method as claimed in claim 1 comprising:
defining, in said plurality of groups, an venous group that comprises only MR data corresponding to an venous heartbeat phase; and
acquiring said MR data in said venous group using a continuous blood flow.

6. A method as claimed in claim 1 comprising:
in said processor, implementing a Fourier transformation of the acquired MR data in k-space in order to generate a frequency spectrum of said MR data;
in said processor, filtering said frequency spectrum in order that frequencies of the MR data in said selected one of said groups are not suppressed; and
determining said MR data for said selected group from a result of said filtering.

7. A method as claimed in claim 1 comprising generating said MR angiography image in an iterative reconstruction algorithm in which information represented by unacquired MR data of said volume segment is supplemented based on known characteristics of the MR angiography image to be generated.

8. A method as claimed in claim 7 comprising:
operating said MR data acquisition unit to acquire said MR data with multiple radio-frequency (RF) reception coils of said MR data acquisition unit; and
implementing said iterative reconstruction algorithm utilizing a spatial redundancy in the acquired MR data that exists due to acquisition with said plurality of RF reception coils, said spatial redundancy compensating for an absence of complete image information within the acquired MR data.

9. A magnetic resonance (MR) apparatus comprising:
an MR data acquisition unit;
a memory configured to represent k-space;
a control unit configured to operate said MR data acquisition unit, in which a living subject is located, to acquire MR data from a predetermined three-dimensional volume segment of the subject, and to enter the acquired MR data into k-space in said memory along multiple radial trajectories in k-space;
a processor configured to automatically execute an analysis of the MR data entered into k-space in order to subdivide said MR data entered into k-space into a plurality of individually selectable groups, with said analysis causing each group to comprise only MR data acquired during a predetermined heartbeat phase of the heart of the subject; and
said processor being configured to generate an MR angiography image using only MR data from a selected one of said of groups.

10. A non-transitory, computer-readable data storage medium encoded with programming instructions, said data storage medium being loaded in a computerized control and evaluation system of a magnetic resonance (MR) apparatus that comprises an MR data acquisition unit, said programming instructions causing said control and evaluation system to:
operate said MR data acquisition unit, in which a living subject is located, to acquire MR data from a predetermined three-dimensional volume segment of the subject, and entering the acquired MR data into k-space along multiple radial trajectories in k-space;
execute an analysis of the MR data entered into k-space in order to subdivide said MR data entered into k-space into a plurality of individually selectable groups, with said analysis causing each group comprising to comprise only MR data acquired during a predetermined heartbeat phase of the heart of the subject; and
generate an MR angiography image using only MR data from a selected one of said groups.

* * * * *